(12) United States Patent
Park

(10) Patent No.: US 8,193,052 B2
(45) Date of Patent: Jun. 5, 2012

(54) FLASH MEMORY DEVICE AND METHOD OF MANUFACTURING THE SAME

(75) Inventor: Sung Kun Park, Chungbuk (KR)

(73) Assignee: Dongbu Hitek Co., Ltd., Seoul (KR)

( * ) Notice: Subject to any disclaimer, the term of this patent is extended or adjusted under 35 U.S.C. 154(b) by 166 days.

(21) Appl. No.: 12/641,410

(22) Filed: Dec. 18, 2009

(65) Prior Publication Data

US 2010/0163960 A1 Jul. 1, 2010

(30) Foreign Application Priority Data

Dec. 31, 2008 (KR) ................. 10-2008-0138873

(51) Int. Cl.
*H01L 21/8238* (2006.01)
(52) U.S. Cl. ................. 438/201; 438/211; 257/E21.179

(58) Field of Classification Search ............ 438/201, 438/211, 257, 593; 257/E21.179, E21.422, 257/E21.68
See application file for complete search history.

(56) References Cited

U.S. PATENT DOCUMENTS

2005/0207199 A1* 9/2005 Chen et al. .............. 365/51
* cited by examiner

*Primary Examiner* — Hoai V Pham
(74) *Attorney, Agent, or Firm* — Saliwanchik, Lloyd & Eisenschenk

(57) ABSTRACT

Disclosed is a flash memory device and a method of manufacturing the same. The flash memory device includes a floating gate formed on a semiconductor substrate, a select gate self-aligned on one sidewall of the floating gate, and an ONO pattern interposed between the floating gate and the select gate. A self-aligned split gate structure is formed for an EEPROM tunnel oxide cell flash memory device employing a split gate structure, so that a cell current is constant and the erasing characteristic between cells is uniform, thereby improving the reliability.

12 Claims, 10 Drawing Sheets

FLASH MEMORY DEVICE AND METHOD OF MANUFACTURING THE SAME

CROSS-REFERENCE TO RELATED APPLICATION

This application claims the benefit under 35 U.S.C. §119 of Korean Patent Application No. 10-2008-0138873, filed Dec. 31, 2008, which is hereby incorporated by reference in its entirety.

BACKGROUND

Generally, a non-volatile memory retains data even if power is switched off. Accordingly, the non-volatile memory is mainly used for data storage of a PC bias, a set-top box, a printer, and a network server. Recently, the non-volatile memory is used in a digital camera and a portable phone.

Among the non-volatile memories, an electrically erasable programmable read-only memory (EEPROM)-type flash memory device erases data of a memory cell all at once or according to a sector unit. In programming, the flash memory device generates channel hot electrons from a drain and charges the electrons in a floating gate, thereby increasing a threshold voltage of a cell transistor.

In erasing, the flash memory device generates a high voltage between a source/substrate and the floating gate to emit electrons from the floating gate such that the threshold voltage of the cell transistor can be lowered.

Recently, as high integration is rapidly performed, the reduction of a cell size is required. An EEPROM tunnel oxide cell (ETOX) currently has the smallest cell size and has an array structure in which two polysilicon patterns are stacked. A lower polysilicon pattern of the two polysilicon patterns may serve as a floating gate, and an upper polysilicon pattern may serve as a select gate.

In this structure, over-erase may occur.

In order to solve the over-erase, a cell having a split gate structure is used.

Although the over-erase has been solved by employing the split gate structure, the length of a gate of a transistor serving as the select gate may be varied by a misalignment degree, effecting an erase state due to the misalignment between the floating gate and the control gate. Accordingly, a difference is made in current distribution. In other words, uniform characteristics are not represented between cells.

If a common source structure is used to reduce a cell size, the current of even/odd word lines arranged at each side of a source line may be varied.

As described above, when forming a gate, an erase current and a coupling ratio have variations due to a photo process and overlay variation, so that uniform erase characteristics cannot be ensured between cells, and reliability of the flash memory device is degraded.

BRIEF SUMMARY

An embodiment provides a flash memory device and a method of manufacturing the same, capable of representing uniform erase characteristics between cells by forming a self-aligned split gate structure in an EEPROM tunnel oxide cell (ETOX)-type flash memory device employing a split gate structure.

An embodiment provides a flash memory device and a method of manufacturing the same, capable of increasing a coupling ratio by forming a tall floating gate, and forming a select gate on a sidewall of the floating gate.

An embodiment provides a flash memory device and a method of manufacturing the same, capable of representing a constant cell current by self-aligning a select gate on a sidewall of a floating gate.

According to an embodiment, a flash memory device includes a floating gate formed on a semiconductor substrate, a select gate self-aligned on one sidewall of the floating gate, and an ONO pattern interposed between the floating gate and the select gate.

According to an embodiment, a method of manufacturing a flash memory device includes forming a floating gate on a semiconductor substrate and a hard mask on the floating gate; forming an ONO pattern on a sidewall of the floating gate and the hard mask; forming a polysilicon pattern on the ONO pattern on the sidewall of the floating gate and the hard mask; and forming a select gate by removing a portion of the polysilicon pattern.

According to an embodiment, a flash memory device includes word lines including select gates aligned in one direction; floating gates spaced apart from each other by a predetermined distance along one side of each of the word lines; a source area formed at one side of each of the floating gates; and a drain area formed in opposition to the source area along a side of each of the word lines.

According to an embodiment, a method of manufacturing a flash memory device includes forming floating gates spaced apart from each other by a predetermined distance; forming an ONO pattern on a lateral side of each of the floating gates, forming a word line including select gates aligned in one direction along one sidewall of the floating gates while being connected to each other; forming a source area at one side of each floating gate; and forming a drain area at one side of the word line in opposition to the source area.

DETAILED DESCRIPTION

Figure 1A:
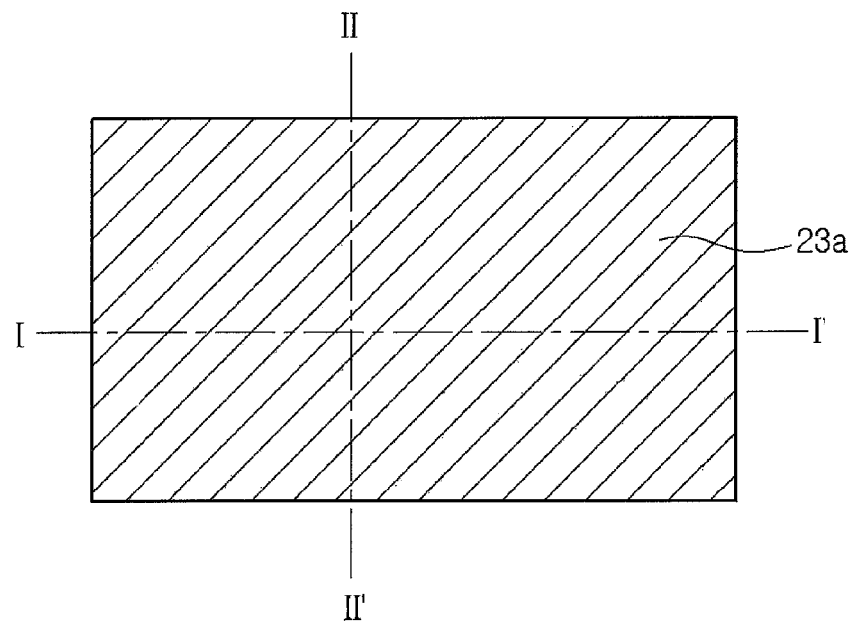
FIGS. 1A to 9 show plan and cross-sectional views illustrating a method of manufacturing a flash memory device according to an embodiment.

Hereinafter, embodiments a flash memory and a method of manufacturing the same will be described in detail with reference to accompanying drawings.

In the description of embodiments, it will be understood that when a layer (or film) is referred to as being 'on/over' another layer or substrate, it can be directly on another layer or substrate, or intervening layers may also be present. Further, it will be understood that when a layer is referred to as being 'under/below' another layer, it can be directly under another layer, or one or more intervening layers may also be present. In addition, it will also be understood that when a layer is referred to as being 'between' two layers, it can be the only layer between the two layers, or one or more intervening layers may also be present.

The thickness and size of each layer shown in the drawings may be simplified or exaggerated for the purpose of convenience or clarity. The real size of the elements may be different from the size of elements shown in drawings.

Detailed description about well-known functions or configurations may make the subject matter of the disclosure unclear. Accordingly, hereinafter, description will be made regarding components directly related to the technical scope of the disclosure.

Embodiments are applicable to a self aligned source (SAS) structure in addition to a memory common source (MCS) structure.

FIGS. 1A, 2A, 3A, 4A, 5A, 6A, 7A, and 8A are plan views of a manufacturing process of the flash memory device according to an embodiment. FIGS. 1B, 2B, 3B, 4B, 5B, 6B, 7B, and 8B are cross-sectional views taken along line I-I' of FIGS. (1-8)A. FIGS. 1C, 2C, 3C, 4C, 5C, 6C, 7C, and 8C are cross-sectional views taken along line II-IF of FIGS. (1-8)A. FIG. 9 is a cross-sectional view showing the flash memory device according to an embodiment.

Figure 1B:
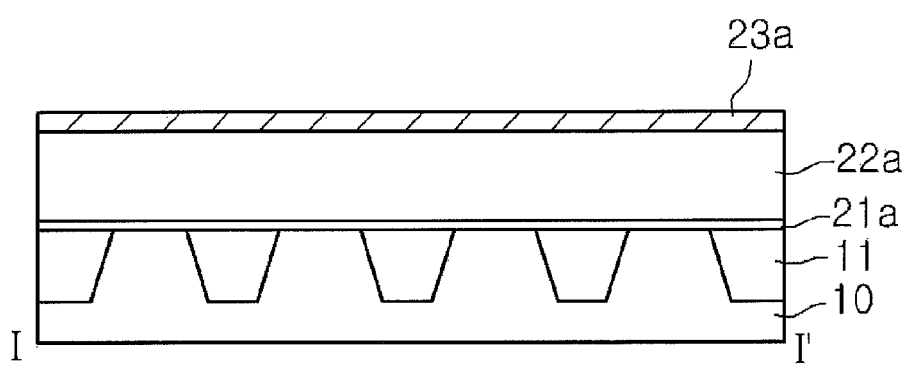
Figure 1C:
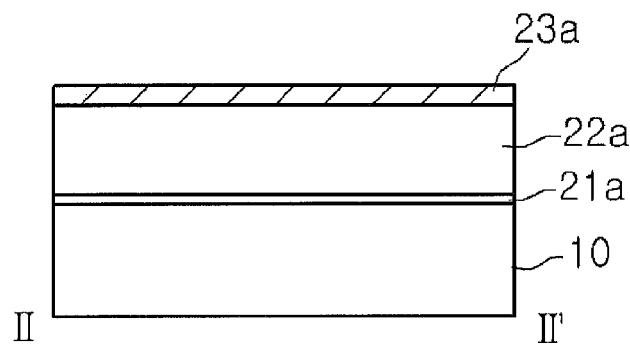

Referring to FIGS. 1A to 1C, an isolation layer 11 is formed in a semiconductor substrate 10 to define an active area. The isolation layer 11 may be formed by filling an insulating layer in a trench after the trench has been formed to a predetermined depth in the semiconductor substrate 10 through an etch process.

A tunnel oxide layer 21a is grown from the semiconductor substrate 10 having the isolation layer 11, and a first polysilicon layer 22a is deposited by a thickness based on a coupling ratio.

The first polysilicon layer 22a is formed as a floating gate, and a select gate is formed at a sidewall of the floating gate in accordance with an embodiment. Therefore, the thickness of the floating gate may exert a direct influence on the coupling ratio.

The first polysilicon layer 22a may include doped polysilicon. In addition, the first polysilicon layer 22a may be formed by doping undoped polysilicon through a subsequent ion implantation process of forming a source/drain after undoped polysilicon has been deposited.

A hard mask layer 23a is formed on the first polysilicon layer 22a.

The hard mask layer 23a may be formed by depositing at least one of an oxide layer, an oxynitride layer, and a nitride layer, through a chemical vapor deposition (CVD) scheme.

Figure 2A:
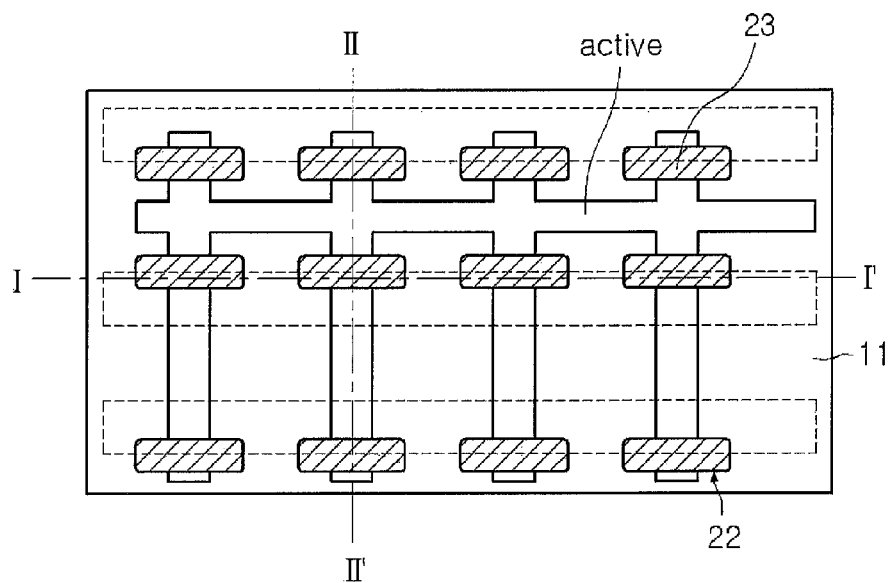
Figure 2B:
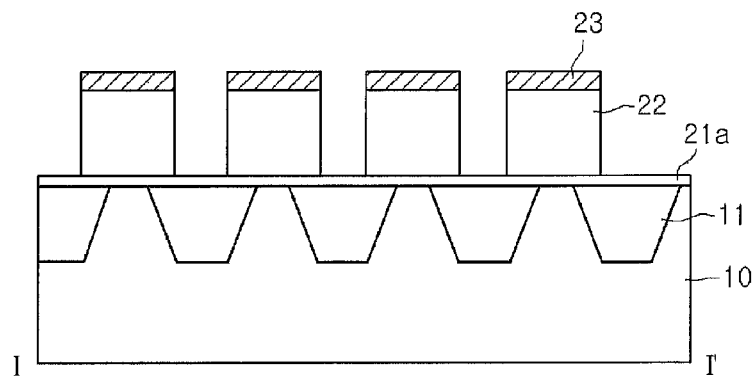
Figure 2C:
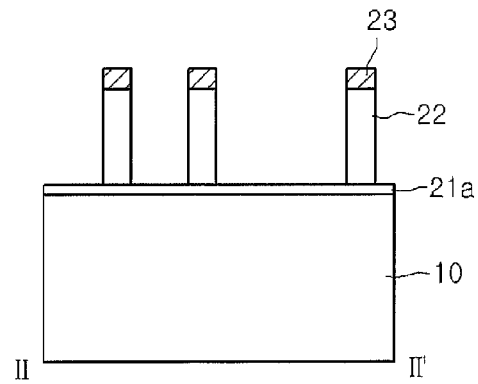

Referring to FIGS. 2A to 2C, a hard mask 23 is formed by patterning the hard mask layer 23a, and a floating gate 22 is formed by patterning the first polysilicon layer 22a using the hard mask 23 as an etch mask.

Floating gates 22 are isolated from each other in each active region (see FIG. 2A).

Preferably, after forming the floating gate 22 by etching the first polysilicon layer 22a, the hard mask 23 is not removed.

The dotted lines of FIG. 2A represent a position wherein a select gate is formed in a subsequent process, and is marked in FIG. 2A for the purpose of comprehension about the structure and the operation of a device.

Figure 3A:
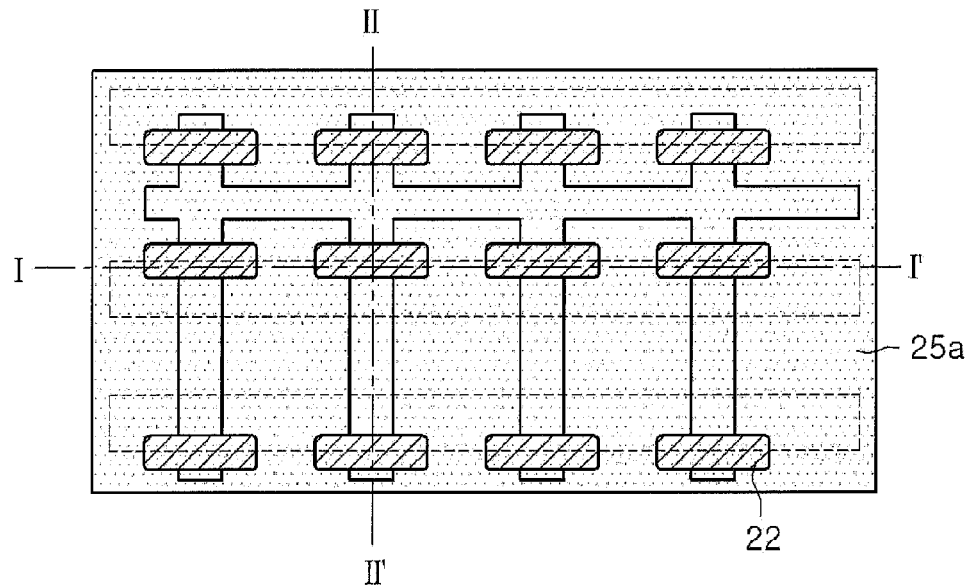
Figure 3B:
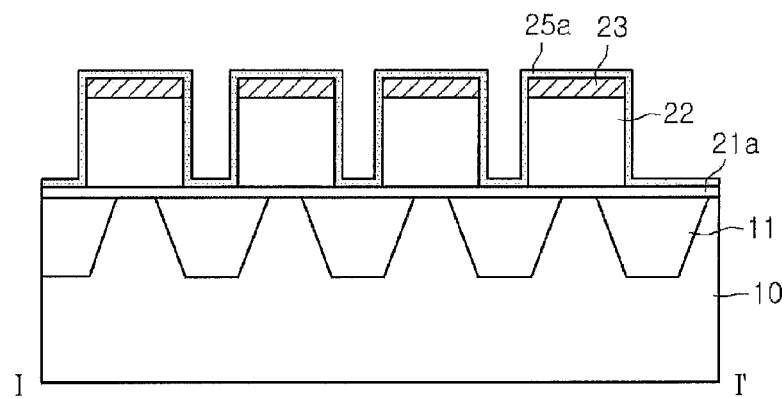
Figure 3C:
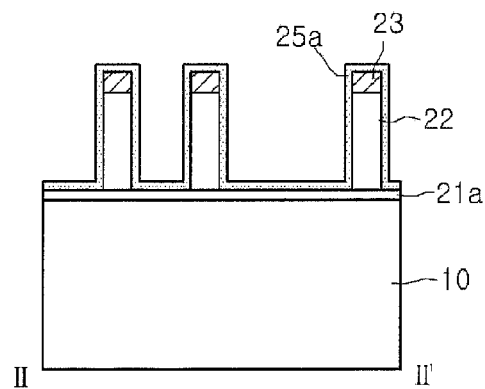

Referring to FIGS. 3A to 3C, an ONO layer 25a is formed on the entire surface of the semiconductor substrate 10 having the floating gate 22.

The ONO layer 25a may be formed by sequentially depositing an oxide layer, a nitride layer, and an oxide layer through a CVD scheme. Each of the oxide layer, the nitride layer, and the oxide layer may be formed at a thickness of 50 Å to 100 Å.

The ONO layer 25a allows the floating gate 22 to sufficiently endure a break-down voltage without F-N tunneling when a coupling bias is applied to the floating gate 22 due to a bias that has been applied to the select gate.

The ONO layer 25a is formed at a lateral side of the floating gate 22 opposite to the select gate to protect the floating gate 22, so that advantageous effects can be obtained in terms of retention.

Instead of the ONO layer 25a, in an alternate embodiment, an insulating layer can be employed by using at least one of an oxide layer and a nitride layer.

Figure 4A:
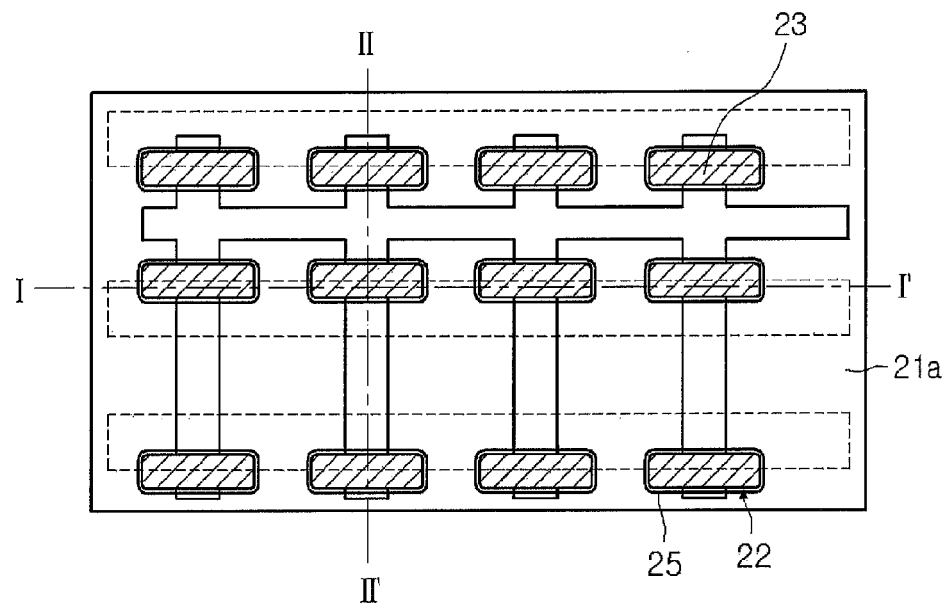
Figure 4B:
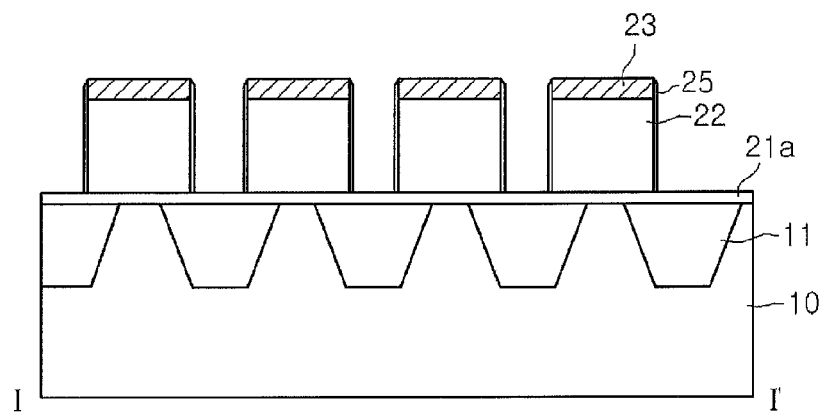
Figure 4C:
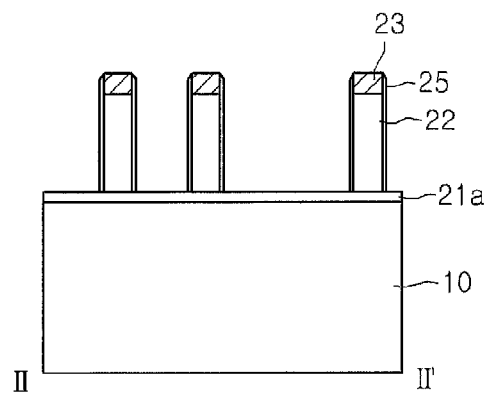

Referring to FIGS. 4A to 4C, an etch-back process is performed with respect to the ONO layer 25a formed on the surface of the semiconductor substrate 10 and the floating gate 22, thereby forming an ONO pattern 25 at the sidewalls of the floating gate 22.

The ONO pattern 25 is formed as a spacer along the lateral sides of the floating gate 22. The ONO layer 25a is removed from the top surface of the floating gate 22 (by being removed from the top surface of the hard mask 23) and the semiconductor substrate 10.

Since the hard mask 23 remains on the top surface of the floating gate 22, the hard mask 23 protects the floating gate 22 in an etch process to form the ONO pattern 25 on the sidewalls of the floating gate 22.

Figure 5A:
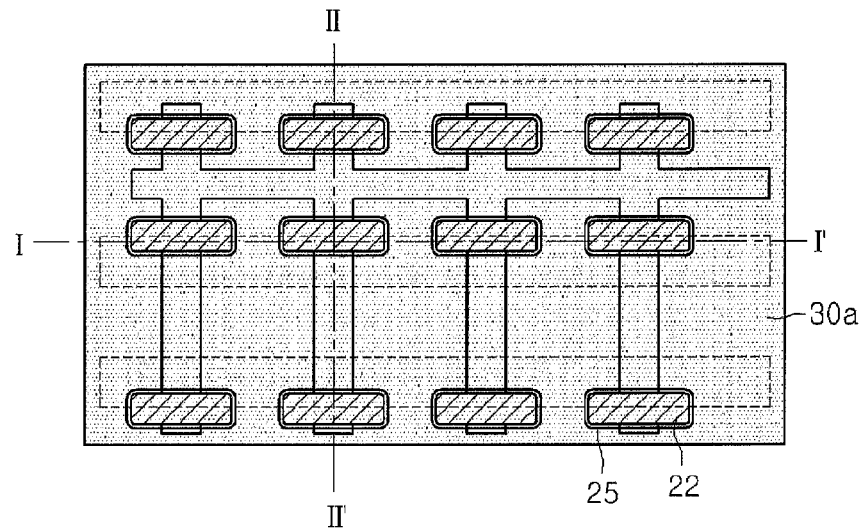
Figure 5B:
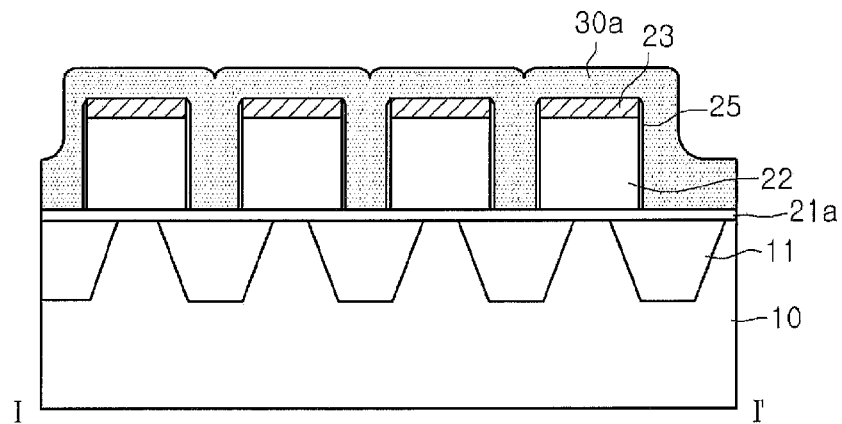
Figure 5C:
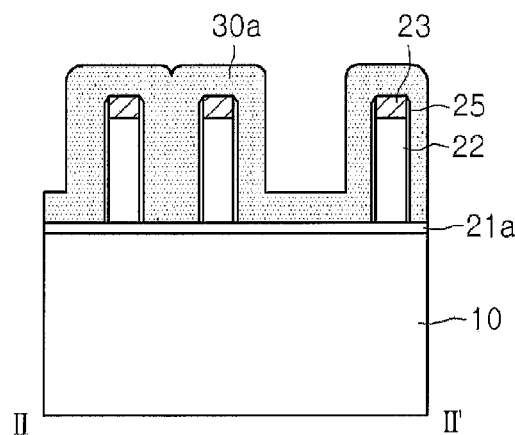

Referring to FIGS. 5A to 5C, in order to form a device of a logic area and a select gate of the cell area, a second polysilicon layer 30a is formed on the entire surface of the semiconductor substrate 10 having the floating gate 22 and the ONO pattern 25.

A gate oxide layer for logic and select transistors may be formed before the second polysilicon layer 30a has been formed.

In the step of forming the gate oxide layer, a structure capable of enhancing the select gate and the ONO pattern can be formed with a CVD oxide layer such as a high temperature oxide (HTO).

For example, a flash cell inter-poly-oxide layer and an oxide layer of the select gate may be formed by using an HTO oxide layer and a thermal oxide layer. A gate of a logic area can be formed by using a thermal oxide layer having a double thickness.

The second polysilicon layer 30a is gap-filled in a word line direction while adjusting the interval between floating gates 22. In a bit line direction, the second polysilicon layer 30a is gap-filled in a source area, but not gap-filled in a drain area.

In other words, in the bit line direction, the floating gates 22 are narrowly arranged at both sides of the drain area, and widely arranged at both sides of the source area. Therefore, the second polysilicon layer 30a gap fills the narrowly arranged floating gates, but not the regions between widely arranged floating gates.

For example, when the second polysilicon layer 30a is deposited at a thickness of 2000 Å, the interval between the floating gates 22 in the word line direction and the interval between the floating gates 22 arranged at both sides of the source area in the bit-line direction preferably correspond to two times or less (4000 Å or less) the thickness of the polysilicon layer 30a. In addition, the floating gates 22 arranged at both sides of the drain area in the bit line direction preferably have the interval enough to cover two times or more (4000 Å or more) the thickness of the polysilicon layer 30a and the space for a drain contact.

Figure 6A:
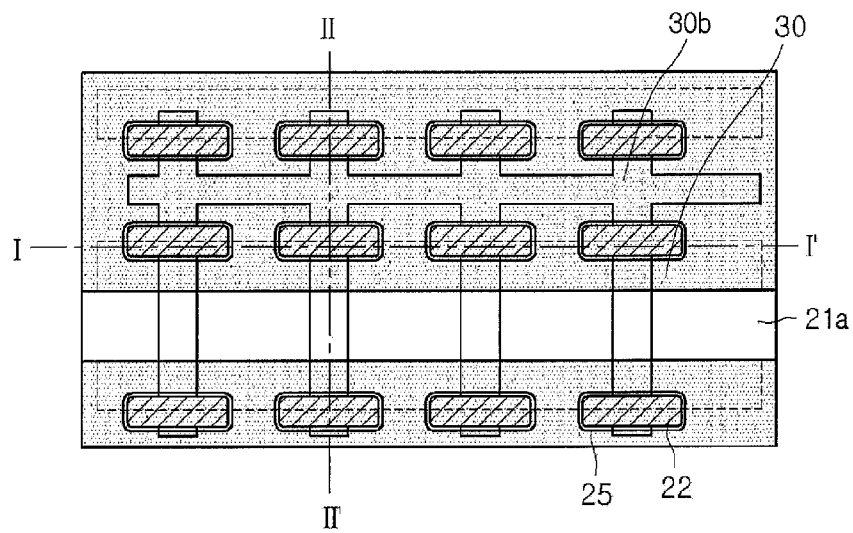
Figure 6B:
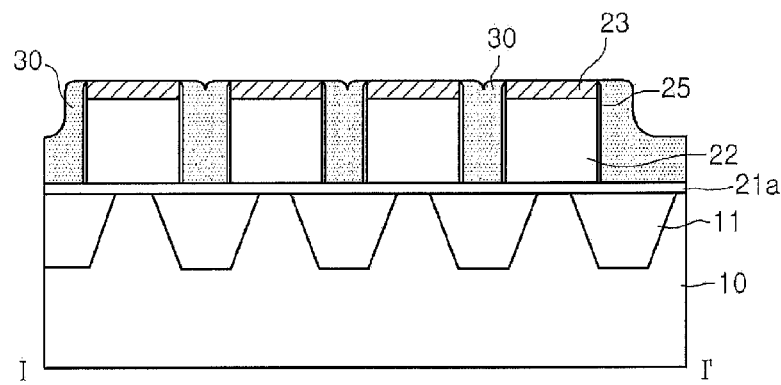
Figure 6C:
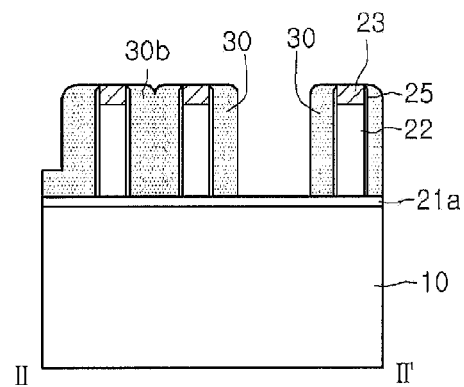

Referring to FIGS. 6A to 6C, the second polysilicon layer 30a is subject to an etch-back process to form the select gate.

Through the etch-back process, the hard mask 23 on the top surface of the floating gate 22 and the semiconductor substrate 10 of the drain area are exposed. In this case, a tunneling oxide layer may be removed from the drain area, but in certain embodiments the tunneling oxide layer remains.

The hard mask 23 formed on the floating gate 22 protects the floating gate 22 from the etch-back process for the second polysilicon layer 30a performed to form the select gate.

The second polysilicon layer 30a is gap-filled between the floating gates 22 in the word line direction and between the floating gates 22 arranged at both sides of the source area in the bit line direction. For this reason, even though the etch-back process is performed, the second polysilicon layer 30a is not completely removed from the substrate (shown as remaining pattern 30b).

In addition, since the second polysilicon layer 30a is not completely gap-filled in the drain area, the second polysilicon layer 30a can be completely removed from the drain area.

Accordingly, polysilicon spacers formed at both sides of the drain area by the etch-back process can be used as the select gates 30. Therefore, even if the floating gate 22 is fully charged with positive charges, a current can be adjusted in the select gate 30.

Since the select gates 30 are formed through an etch-back process for the second polysilicon layer 30a, the select gates 30 have uniform lengths over the whole cell. Accordingly, irregular cell characteristics caused by overlay and CD variation in a photo process can be solved.

Figure 7A:
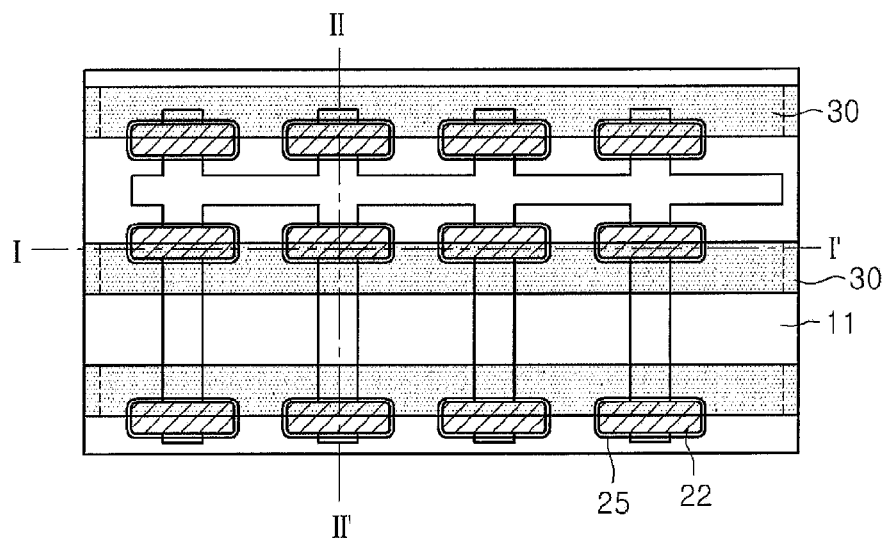
Figure 7B:
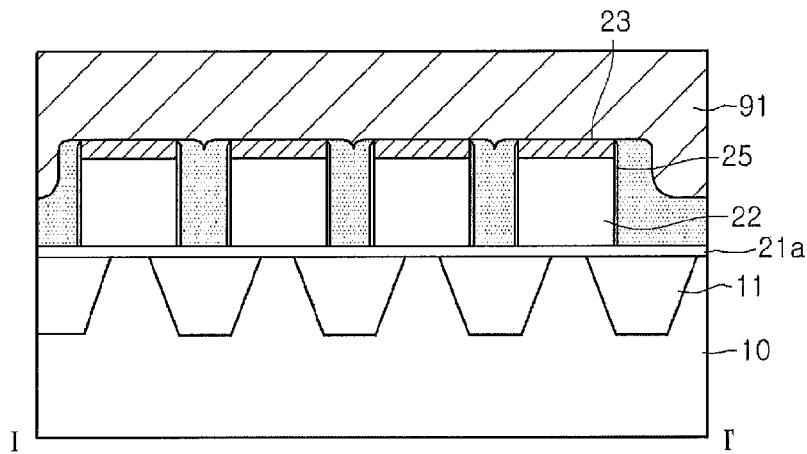
Figure 7C:
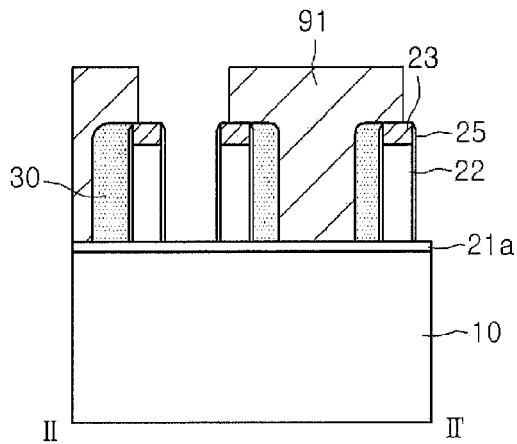

Referring to FIGS. 7A to 7C, a photoresist pattern 91 is formed on the substrate to cover word line regions, and the second polysilicon remaining patterns 30b from both sides of the source area in the bit line direction are removed using the photoresist pattern 91 as an etch mask. Accordingly, the select gate 30 may serve as a split gate.

The photoresist pattern 91 is an auxiliary pattern to remove the second polysilicon remaining pattern 30b. Substantially, the second polysilicon remaining pattern 30b may be removed through self-alignment by using the hard mask 23 as an etch passivation layer.

The select gates 30 are formed at both sides of the drain area in the word line direction by removing the second polysilicon remaining patterns 30b. Accordingly, the select gate 30 is formed on one sidewall of each of the floating gates 22 arranged in the word line direction.

The photoresist pattern 91 is not shown in the plan view of FIG. 7A.

Thereafter, although not shown, a lightly doped drain (LDD) is formed through an re-implant process.

Figure 8A:
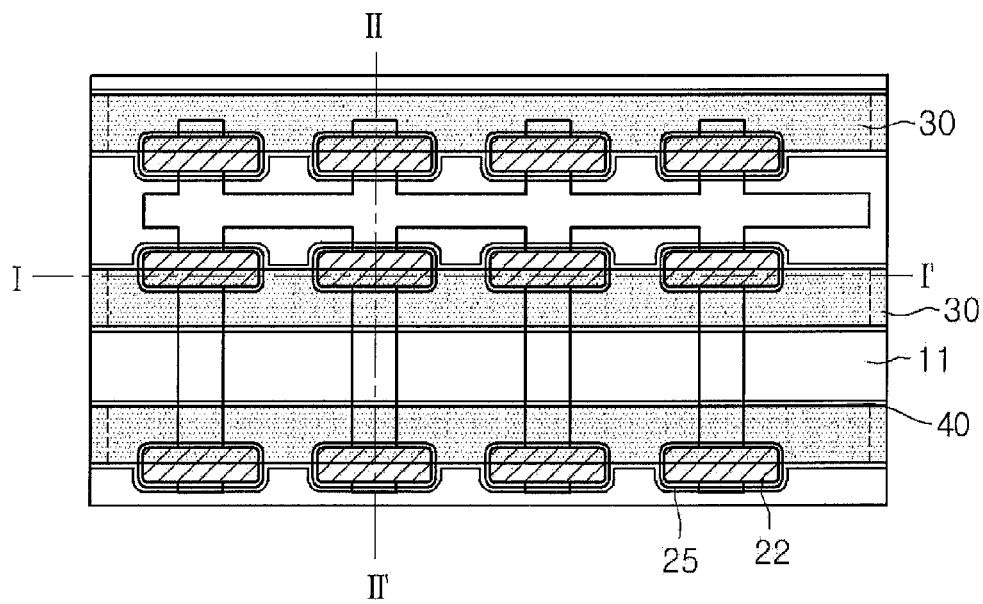
Figure 8B:
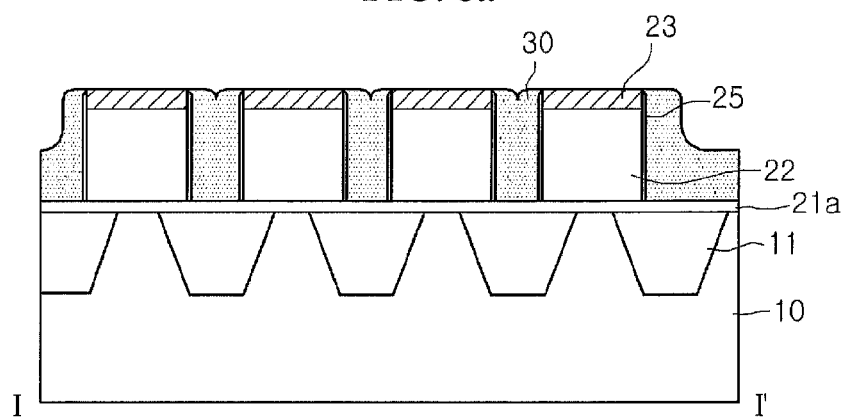
Figure 8C:
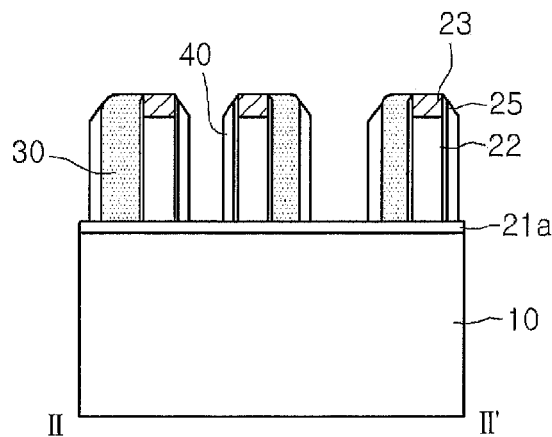
Figure 9:
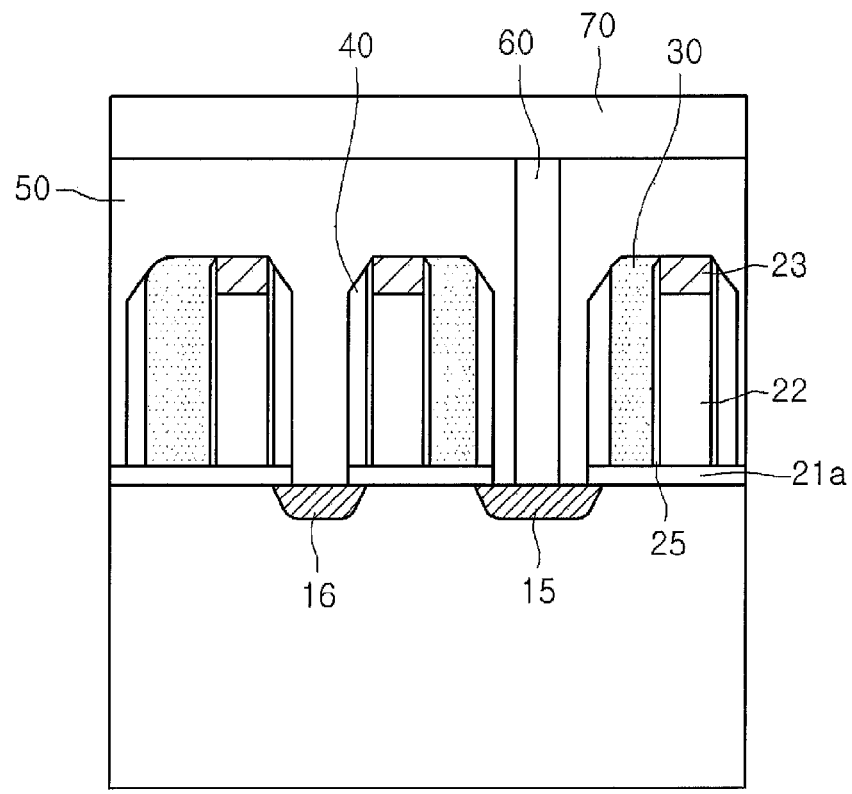

Referring to FIGS. 8A to 8C, an insulating layer is formed on the entire surface of the semiconductor substrate 10, and gate spacers 40 are formed on sidewalls of the select gates 30 and the floating gates 22 through an etch-back process of the insulating layer.

The gate spacers 40 may be formed on the ONO pattern 25 on the sidewall of the floating gates 22 arranged at both sides of the source area. The gate spacers 40 may also be formed on the sidewall of the select gate 30 at the sidewall of the floating gates 22 arranged at both sides of the drain area.

Referring to FIG. 9, source and drain areas 16 and 15 may be formed in the active areas for the source and drain areas through an n+ implant process.

The source area 16 may be formed in the active area between the adjacent floating gates 22, and the drain area 15 may be formed in the active area between the adjacent select gates 30.

The flash memory device manufactured in the above method is shown in FIG. 9.

According to an embodiment, the floating gate 22 and the select gate 30 are horizontally arranged on the semiconductor substrate 10, and the ONO pattern 25 is interposed between the floating gate 22 and the select gate 30. The hard mask 23 is formed on the floating gate 22. The source area 16 is formed on the semiconductor substrate 10 at one side of the floating gate 30, and the drain area 15 is formed on the semiconductor substrate 10 at one side of the select gate 30 in opposition to the source area 16. The tunneling oxide layer 21a is formed between the floating gate 22 and the semiconductor substrate 10. A pre-metal dielectric (PMD) layer 50 is formed on the entire surface of the semiconductor substrate 10 having the floating gate 22 and the select gate 30. A contact hole for contact is formed, and a metal such as tungsten is gap-filled in the contact hole to form a contact electrode 60. After depositing a metal layer on the PMD layer 50, the metal layer is patterned to form a metal line 70 connected to the contact electrode 60. The metal line 70 may be for a bit line.

The select gate 30 is formed on a sidewall of the floating gate 22 and the hard mask 23 through self-alignment. The height of the select gate 30 may be determined according to the combined height of the floating gate 22 and the hard mask 23. As the height of the floating gate 22 and the hard mask 23 is increased, a coupling ratio is increased.

Since the select gate 30 formed through the self-alignment method exits on the sidewall of the floating gate 22 and does not exist on the top surface of the floating gate 22, excessive erasure can be inhibited. Since the select gates 30 have uniform lengths over the whole cell, an erasing current is also uniform, so that superior reliability can be ensured.

Figure 10:
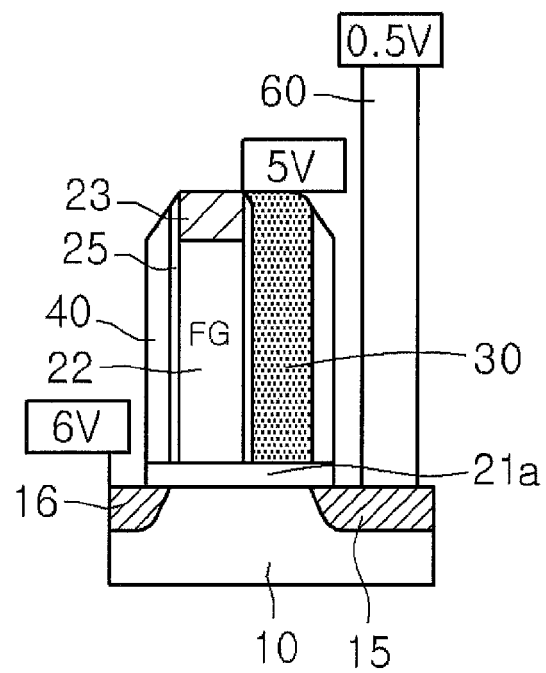
FIGS. 10 to 12 are cross-sectional views showing the operational procedure of the flash memory device according to an embodiment.
Figure 11:
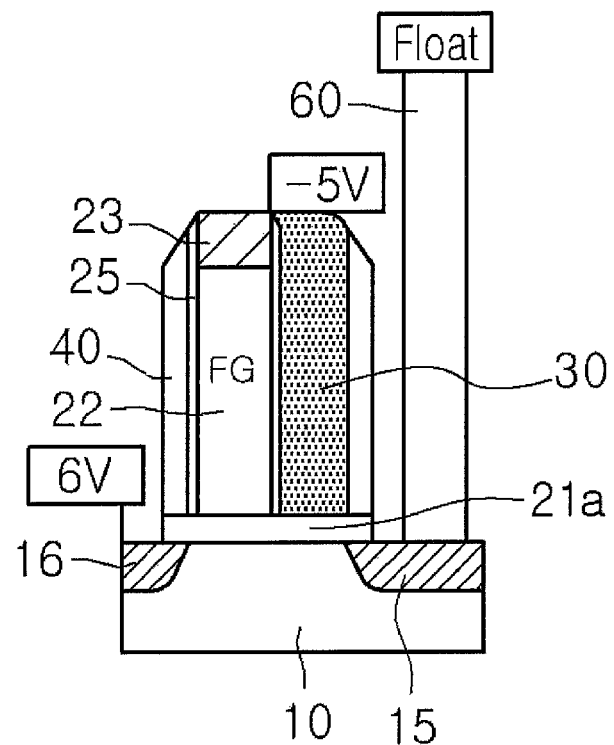
Figure 12:
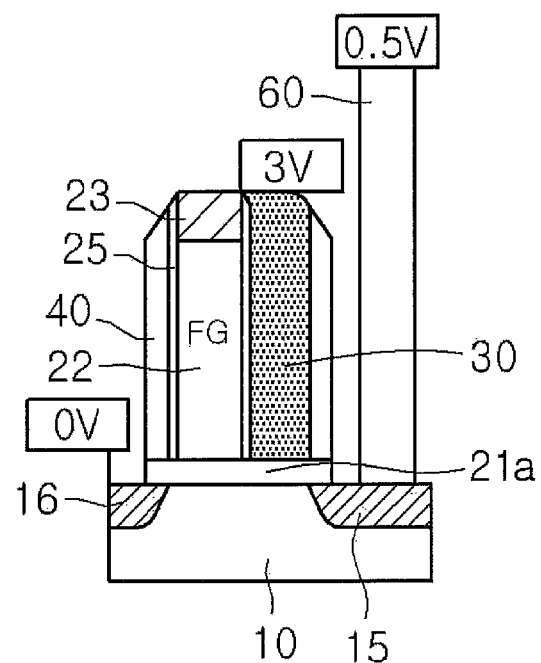

FIGS. 10 to 12 are cross-sectional views showing the operation of the flash memory device according to an embodiment.

The flash memory device according to an embodiment can be variously programmed an erased. Hereinafter, programming, erasing, and reading operations will be described.

A programming operation of a device according to an embodiment will be described below with reference to FIG. 10.

In the programming operation, a voltage of 5V is applied to the select gate 30 (the word line), a voltage of 6V is applied to the source area 16, a voltage of 0.5V is applied to the drain area 15, and a bulk (substrate body) is grounded.

In this case, a channel is formed from the drain area 15 to the source area 16, so that hot carriers are injected into the floating gate 22 through the tunneling oxide layer 21a, thereby achieving the programming. This is called a hot carrier injection (HCI) scheme.

The erasing operation of the device will be described below with reference to FIG. 11.

In the erasing operation, a voltage of −5V is applied to the select gate 30, that is, the word line, and a voltage of 6V is applied to the source area 16. The bulk is grounded. In this case, the drain 15 is floated.

Accordingly, the erasing operation is performed through band to band tunneling (BTBT) between the source area 16 and the floating gate 22.

The reading operation for the device will be described below with reference to FIG. 12.

A voltage of 3V is applied to the select gate 30, that is, the word line, and a voltage of 0V is applied to the source area 16. The bulk is grounded.

The reading scheme is generally known to those skilled in the art. Since the floating gate 22 is provided at the side of the source area, the channel may be advantageously connected or disconnected according to the existence of electrons of the floating gate 22. Accordingly, as shown in FIG. 10, since a voltage of 0.5V has been programmed, the voltage of 0.5V can be read through the drain area 15 as shown in FIG. 12.

According to an embodiment, a self-aligned split gate structure is formed for an EEPROM tunnel oxide cell flash memory device employing a split gate structure, so that a cell current is constant and the erasing characteristic between cells is uniform. Accordingly, the reliability can be improved.

According to an embodiment, the height of the floating gate 22 is increased, and the select gate 30 is formed at the sidewall of the floating gate 22, thereby increasing a coupling ratio. Accordingly, efficiency of the device can be improved.

Embodiments are applicable to the SAS structure in addition to the MCS structure.

According to an embodiment, an ONO layer covers sides of a floating gate, so that a superior retention characteristic and superior reliability can be ensured.

According to an embodiment, since a split gate is not formed through a photo process, the lengths of the select transistors are not irregularly formed by the misalignment of the photo process. Rather, the lengths of the select transistors are determined due to self-alignment. Accordingly, an erasing voltage (the erase threshold voltage Vt) and a cell current are constant, and superior stability can be ensured in the manufacturing process.

According to an embodiment, a hard mask is formed on a floating gate in order to perform an etch process for a select gate, thereby inhibiting an upper portion of the ONO layer between the floating gate and the select gate from being damaged. When the select gate is formed in the subsequent process, the hard mask is used as an etch mask. Accordingly, the same hard mask may be used in multiple steps, so that the manufacturing process can be simplified.

The flash memory device according to an embodiment has a structure in which a current is restricted by the select gate instead of employing an F-N scheme to exert an influence on the Vt due to a coupling ratio. Since the flash memory device according to an embodiment is programmed through an HCI scheme and erased through a BTBT scheme, the flash memory device is rarely affected by the Vt due to the coupling ratio. Accordingly, since the flash memory device has minimal variation in the manufacturing process, the manufacturing process can be easily performed, and superior characteristics of the flash memory device can be obtained.

According to the embodiment, since a select gate is formed on a sidewall of a floating gate through a split gate scheme, over-erase occurring in an ETOX cell can be solved. Accordingly, a chip over-head cost can be reduced.

In addition, according to an embodiment, since a floating gate is adjacent to a source area, a channel can be easily disconnected after programming and easily connected after erasing.

According to an embodiment, a hard mask is used on a floating gate. Etch processes for a floating gate, an ONO layer, and a select gate, and a removal process for a polysilicon remaining pattern are performed through self-alignment using the hard mask. Accordingly, CD variation caused in a photo process and the risk of misalignment can be minimized.

Although an embodiment has been described with reference to a number of illustrative embodiments thereof, it should be understood that numerous other modifications and embodiments can be devised by those skilled in the art that will fall within the spirit and scope of the principles of this disclosure.

What is claimed is:

1. A method of manufacturing a flash memory device, the method comprising:
    forming a floating gate on a semiconductor substrate and a hard mask on the floating gate;
    forming an ONO pattern on a sidewall of the floating gate and the hard mask;
    forming a polysilicon pattern on the ONO pattern on the sidewall of the floating gate and the hard mask; and
    forming a select gate by removing a portion of the polysilicon pattern,
    wherein the forming of the ONO pattern comprises:
        forming an ONO layer on the semiconductor substrate having the floating gate and the hard mask; and
        performing an etch back process for the ONO layer.

2. The method of claim 1, wherein forming the floating gate on the semiconductor substrate forms one floating gate in each active region of a cell region of the semiconductor substrate, wherein the floating gates are isolated from each other.

3. The method of claim 1, wherein the forming of the polysilicon pattern comprises:
    forming a polysilicon layer on an entire surface of the semiconductor substrate; and
    performing an etch back process with respect to the polysilicon layer, thereby exposing the hard mask and remaining the polysilicon layer on the sidewall of the floating gate,
    wherein the floating gate and hard mask are formed in plurality, wherein the polysilicon pattern is connected between closely adjacent floating gates.

4. The method of claim 3, wherein, when forming the select gate by removing the portion of the polysilicon pattern, the portion of the polysilicon pattern removed corresponds to the connected polysilicon pattern between the closely adjacent floating gates.

5. The method of claim 1, further comprising:
    forming an insulating layer on the semiconductor substrate;
    forming a gate spacer at one side of the select gate and one side of the floating gate by performing an etch back process with respect to the insulating layer; and
    forming a source area in a vicinity of the floating gate and a drain area in a vicinity of the select gate by implanting impurities into the semiconductor substrate, after forming the select gate.

6. A method of manufacturing a flash memory device, the method comprising:
    forming a floating gate on a semiconductor substrate and a hard mask on the floating gate;
    forming an ONO pattern on a sidewall of the floating gate and the hard mask;
    forming a polysilicon pattern on the ONO pattern on the sidewall of the floating gate and the hard mask;
    forming a select gate by removing a portion of the polysilicon pattern;
    forming an insulating layer on the semiconductor substrate;
    forming a gate spacer at one side of the select gate and one side of the floating gate by performing an etch back process with respect to the insulating layer; and
    foaming a source area in a vicinity of the floating gate and a drain area in a vicinity of the select gate by implanting impurities into the semiconductor substrate, after forming the select gate.

7. A method of manufacturing a flash memory device, the method comprising:
    forming a floating gate on a semiconductor substrate and a hard mask directly on a top surface of the floating gate;
    forming an ONO pattern on a sidewall of the floating gate and the hard mask;
    forming a polysilicon pattern on the ONO pattern on the sidewall of the floating gate and the hard mask; and
    forming a select gate by removing a portion of the polysilicon pattern.

8. The method of claim 7, wherein the forming of the ONO pattern comprises:
    forming an ONO layer on the semiconductor substrate having the floating gate and the hard mask; and performing an etch back process for the ONO layer.

9. The method of claim 7, wherein forming the floating gate on the semiconductor substrate forms one floating gate in each active region of a cell region of the semiconductor substrate, wherein the floating gates are isolated from each other.

10. The method of claim 7, wherein the forming of the polysilicon pattern comprises:
- forming a polysilicon layer on an entire surface of the semiconductor substrate; and
- performing an etch back process with respect to the polysilicon layer, thereby exposing the hard mask and remaining the polysilicon layer on the sidewall of the floating gate,
- wherein the floating gate and hard mask are formed in plurality, wherein the polysilicon pattern is connected between closely adjacent floating gates.

11. The method of claim 10, wherein, when forming the select gate by removing the portion of the polysilicon pattern, the portion of the polysilicon pattern removed corresponds to the connected polysilicon pattern between the closely adjacent floating gates.

12. The method of claim 11, further comprising:
- forming an insulating layer on the semiconductor substrate;
- forming a gate spacer at one side of the select gate and one side of the floating gate by performing an etch back process with respect to the insulating layer; and
- forming a source area in a vicinity of the floating gate and a drain area in a vicinity of the select gate by implanting impurities into the semiconductor substrate, after forming the select gate.

* * * * *